(12) United States Patent
Baechle et al.

(10) Patent No.: US 9,394,604 B2
(45) Date of Patent: Jul. 19, 2016

(54) APPARATUS AND METHOD FOR SPUTTER-DEPOSITED COATINGS ON FLUIDIZED PARTICLE BEDS

(71) Applicants: Daniel Murphy Baechle, Rosedale, MD (US); Eric D. Wetzel, Baltimore, MD (US)

(72) Inventors: Daniel Murphy Baechle, Rosedale, MD (US); Eric D. Wetzel, Baltimore, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 140 days.

(21) Appl. No.: 13/863,081

(22) Filed: Apr. 15, 2013

(65) Prior Publication Data

US 2014/0308521 A1    Oct. 16, 2014

Related U.S. Application Data

(60) Provisional application No. 61/624,613, filed on Apr. 16, 2012.

(51) Int. Cl.
*C23C 14/50*    (2006.01)

(52) U.S. Cl.
CPC ........... *C23C 14/50* (2013.01); *Y10T 428/2991* (2015.01); *Y10T 428/2993* (2015.01)

(58) Field of Classification Search
CPC ...... C23C 14/50; C23C 14/24; C23C 14/345; Y10T 428/2991; Y10T 428/29937
USPC ............... 428/404, 403; 427/212; 204/192.15
See application file for complete search history.

(56) References Cited

U.S. PATENT DOCUMENTS

| | | | |
|---|---|---|---|
| 3,107,523 A | 10/1963 | Oliver, et al. | |
| 5,203,206 A | 4/1993 | Shofner et al. | |
| 5,224,386 A | 7/1993 | Curtis | |
| 5,271,279 A | 12/1993 | Serra-Tosio et al. | |
| 5,506,053 A * | 4/1996 | Hubbard | 428/402 |
| 5,603,815 A | 2/1997 | Lashmore et al. | |
| 6,288,837 B1 * | 9/2001 | Hubbard | 359/359 |
| 6,679,124 B2 | 1/2004 | Oliver | |
| 7,312,097 B2 * | 12/2007 | Hammerbacher et al. | 438/63 |

* cited by examiner

*Primary Examiner* — Leszek Kiliman
(74) *Attorney, Agent, or Firm* — Christos S. Kyriakou

(57) ABSTRACT

A method and an apparatus for producing metal and ceramic coatings on a fluidized bed of particles or fibers are described. The method utilizes a unique apparatus to transfer vibratory motion through a wall of a deposition chamber in order to produce a fluidized bed of particle or fluidized bed of fibers inside the chamber. The method and apparatus are versatile, allowing particles of different shapes, sizes, materials and masses to be fluidized and coated. The fluidization process allows uniform and conformal coatings on particles and fibers. Coatings of pure metals, alloys, or ceramic materials can be produced.

24 Claims, 3 Drawing Sheets

Schematic of one embodiment through section B-B

Schematic of one embodiment through section A-A of Figure 1

An enlarged schematic of an embodiment of an exemplary sample holder assembly 6

APPARATUS AND METHOD FOR SPUTTER-DEPOSITED COATINGS ON FLUIDIZED PARTICLE BEDS

CROSS-REFERENCE TO RELATED APPLICATIONS

This patent application claims the benefit of U.S. Provisional Patent Application No. 61/324,613 titled "Apparatus and Method for producing sputter-deposited coatings on fluidized particle beds" filed on Apr. 16, 2012 the entire contents which are hereby incorporated by reference herein including all attachments and other documents that were incorporated by reference in U.S. Provisional Patent Application No. 61/324,613.

GOVERNMENT INTEREST

Governmental Interest—The invention described herein may be manufactured, used and licensed by or for the U.S. Government.

FIELD OF INVENTION

Embodiments of the present invention generally relate to an apparatus that transfers vibratory motion through a wall of a deposition chamber to produce a fluidized bed of particles or fibers inside the chamber. The present invention also provides a method of making coated particles, coated fibers and other structures.

BACKGROUND OF THE INVENTION

Coated particles, especially microparticles, have many fields of application: advanced composite materials, medicine, paints and other coatings with controlled optical properties. In composites, conformal coatings can improve chemical compatibility or adhesion between the filler particles and the matrix material. Such coatings can also act as barriers, preventing reaction between particles and the surrounding environment. Barrier coatings can also be semi-permeable; allowing slowed or controlled reactions, such as time-release medicine microparticles. Coatings on microparticles can also be tailored to produce specific desired optical properties. By carefully tuning coating properties, particles can be designed to reflect specific colors, for instance. The coated particles can then be mixed into a matrix material to produce "paint" or a composite with very specific optical properties.

Such diverse applications demand a coating system that can produce a wide variety of coatings on a wide variety of particles. Physical vapor deposition (PVD), including techniques such as sputtering and evaporation, can produce such varied coatings using metals and ceramics. PVD also allows for careful control of deposition rate, and thus coating thickness and composition. Multilayer coatings and custom alloy coatings can be created using multiple PVD sources. When coating particles, the coatings must be conformal and uniform on large numbers of particles. Combining a PVD coating system with a fluidized bed system allows large numbers of particles to be conformally and uniformly coated as required.

A fluidized bed of solid particles can be formed by applying a mechanical vibration to the bed. Under the right vibration conditions, the particle bed reaches a dynamic state in which the particles move rapidly and randomly throughout the material volume, and the system appears to flow like a fluid. The frequency, amplitude and waveform of the vibration can be used to tune the behavior of the fluidized bed. Different bed masses, particle sizes, shapes, and densities can be fluidized by tuning the driving frequency and amplitude of the vibration. The random, dynamic mixing achieved in a fluidized bed makes it an ideal platform for creating full-coverage particle coatings from line-of-sight deposition techniques such as sputtering. Additionally, the random motion of the particle bed results in uniform and consistent particle coatings even if the deposition source is spatially non-uniform.

Previous systems have utilized vibratory motion to create a fluidized bed inside a PVD chamber by placing vibratory sources within the PVD chamber, see for example and U.S. Pat. Nos. 5,506,053 and 6,288,837 to Hubbard and U.S. Pat. No. 7,312,097 to Hammerbacher et al. However, as many PVD operations require controlled environments and sub-ambient pressures, these previous methods have required specialized vibratory sources that can withstand vacuum conditions and material released from the deposition source. These constraints limit the size and flexibility of the coating system, and add considerable expense and maintenance requirements.

The present invention provides a novel method and a novel apparatus for transferring vibratory motion from outside to inside the vacuum chamber to produce a fluidized bed. The method allows the use of non-vacuum rated vibratory sources, thus reducing complexity and cost compared to systems in the previously described patents. The present system also allows a wider variety of coatings to be produced on particles having a larger range of shapes and sizes, compared to systems of the previously described patents. Sputter deposition using multiple sputter sources is employed to produce single- and multi-layer coatings on the fluidized particles. Simultaneous co-sputtering can also produce custom alloy coatings on the fluidized particles. The technique also allows for the randomization of a very high number of particles (for example, millions) whereas simpler shaking or tumbling techniques can only effectively agitate tens or hundreds of particles.

Therefore, the inventors have provided an improved apparatus and methods for coating particles and/or fibers within a chamber which vibratory motion for a fluidized bed is generated externally to a chamber and transmitted into the chamber via a mechanical linkage.

BRIEF SUMMARY OF THE INVENTION

Embodiments of the present provide an apparatus for physical vapor deposition of coatings onto a fluidized bed of particles. A method is also provided that utilizes two systems: a novel system for producing the fluidized bed, and a physical vapor deposition (PVD) system to produce coatings. In one exemplary embodiment the fluidized bed system consists of a function generator, a vibratory shaker, and a series of mechanical linkages (including a rotary motion feedthrough rated to high vacuum, for example less than $10^{-9}$ Torr) to transfer the vibratory motion to the inside of the PVD chamber. The PVD system consists of an evaporation source or multiple sputter sources, as well as the associated power supplies these devices require for DC or RF deposition.

Other and further embodiments of the invention are described in more detail, below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

Embodiments of the present invention include methods for physical vapor deposition of one or more coatings onto a plurality of particles or fibers, that include: placing a plurality of particles or fibers in a holder in a chamber, sealing the chamber, reducing the pressure inside the chamber to create a vacuum, vibrating the holder and the plurality of particles or fibers in the holder with a means for generating vibration wherein the means for generating vibration is external to the chamber and is connected to the holder through the wall of the chamber via a sealed, mechanical linkage that extends through a wall of the chamber, and then depositing a metal or a ceramic coating onto the plurality of particles or fibers. Desirably, the magnitude and frequency of the vibrations is such that the particles or fibers vibrate in a fluid-like, random motion that facilitates physical deposition.

Figure 1:
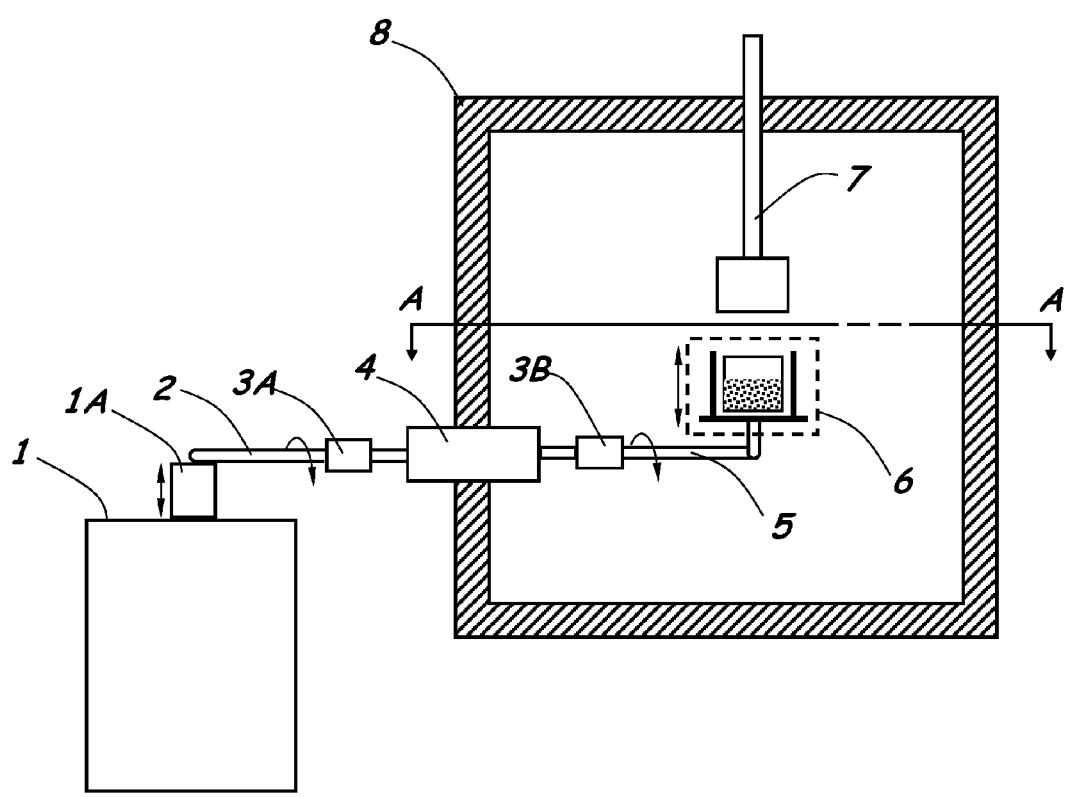
FIG. 1 illustrates a cross-sectional front view of one exemplary embodiment of system of the present invention.
Figure 2:
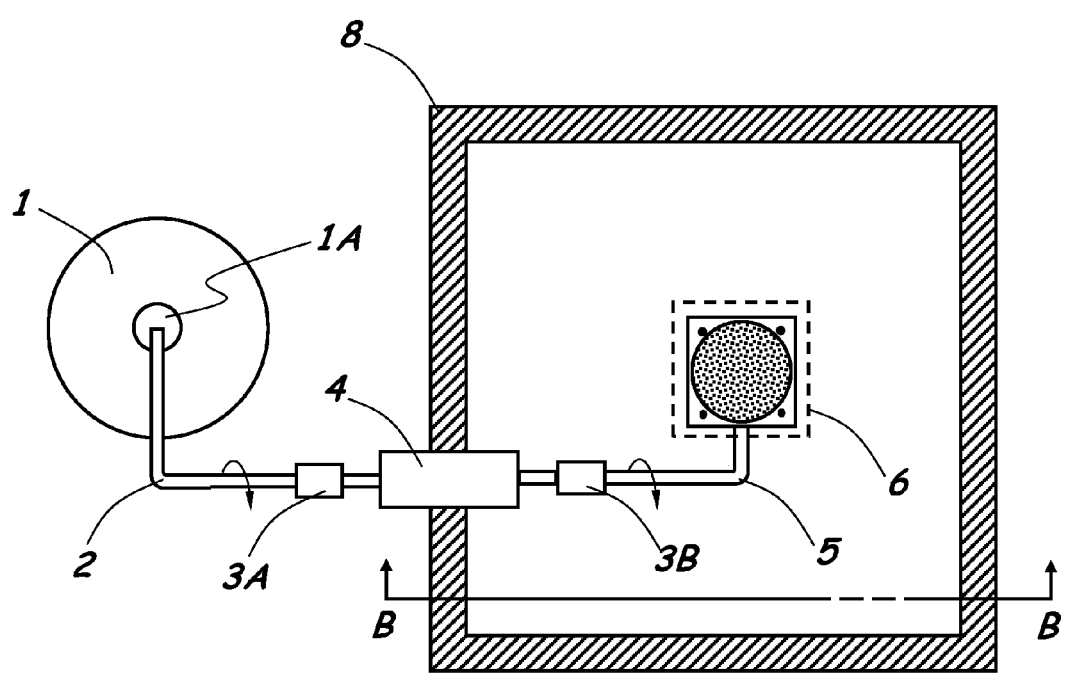
FIG. 2 illustrates a cross-sectional plan view of the exemplary embodiment illustrated in FIG. 1.

FIG. 1 illustrates a cross-sectional, front view of one exemplary embodiment of system of the present invention. FIG. 2 illustrates a cross-sectional plan view of the exemplary embodiment illustrated in FIG. 1. The exemplary system consists of an assembly of devices that can be used together to deposit coatings onto a fluidized bed of particles. In FIGS. 1 and 2, vacuum chamber 8 is sectioned for clarity of illustration. The perspective of FIG. 2 is indicated on FIG. 1 by line A-A. The perspective of FIG. 1 is indicated on FIG. 2 by line B-B.

An exemplary apparatus of the present invention includes a shaker device 1 that produces controlled mechanical vibration. Suggested shaker devices 1 include, but are not limited to, an electromagnetic or piezoelectric shaker or any other known means of providing vibration. Generally, the shaker should be capable of providing shaking in the approximate range of 2-1000 Hz, at least 5 lbf, and at least 0.25-inch peak-to-peak displacement. A suggested commercially available shaker includes, but is not limited to, a PM25A shaker by MB Dynamics. The output head 1A of shaker device 1 is rigidly coupled to a first rigid angled rod 2. First rod 2 may be composed of metal or composite materials. A first shaft coupler 3A rigidly joins first rod 2 to a vacuum-rated rotary motion feedthrough 4. A second shaft coupler 3B rigidly couples feedthrough 4 to a second rigid metal rod 5. Second rod 5 is rigidly connected to the sample holder assembly 6. One or multiple deposition sources 7 are directed at sample holder 6. Exemplary deposition sources 7 include, but are not limited to, RF magnetron sputtering, DC magnetron sputtering, ion-beam assisted sputtering, HiPIM (high-power impulse magnetron) sputtering, and evaporation deposition sources. Desirably, coupler 3B, shaft 5 and sample holder assembly 6 are all completely contained within vacuum chamber 8. Desirably, the vacuum chamber can be operated at sub-atmospheric pressure, preferably below $10^{-3}$ Torr and more preferably below $10^{-6}$ Torr.

Shaker 1, shaft 2 and coupler 3A are all, desirably, completely outside of chamber 8. Rotary feedthrough 4 transfers motion through the chamber wall, and deposition source 7 may have power and water connections through the walls of chamber 8. Shaker 1 vibrates one end of rod 2, which becomes a rotational motion at the other end of rod 2. Coupler 3A transmits the rotational motion to feedthrough 4. Feedthrough 4 transmits the rotary motion through the wall of chamber 8, to coupler 3B. Preferably, the feedthrough is vacuum-rated to $10^{-9}$ Torr or lower, and has a one-piece shaft, so that very small and very fast motion can be transmitted into the vacuum chamber. An exemplary feedthrough is a CF Flanged Solid Shaft—KJLC Standard ferro-magnetic fluid rotary feedthrough purchased from Kurt J. Lesker Company of Jefferson Hills, Pa. that is designed to provide rotary motion under high vacuum. Coupler 3B transmits the rotary motion to one end of shaft 5. The other end of shaft 5 effectively vibrates in an up and down motion, thus vibrating the sample holder assembly 6, and ultimately creating a fluidized bed of particles 15. This arrangement simplifies shaker 1 selection, design and maintenance as the shaker does not require seals, oils, electronics, and other parts that can withstand high vacuum for extended periods of time.

Figure 3:
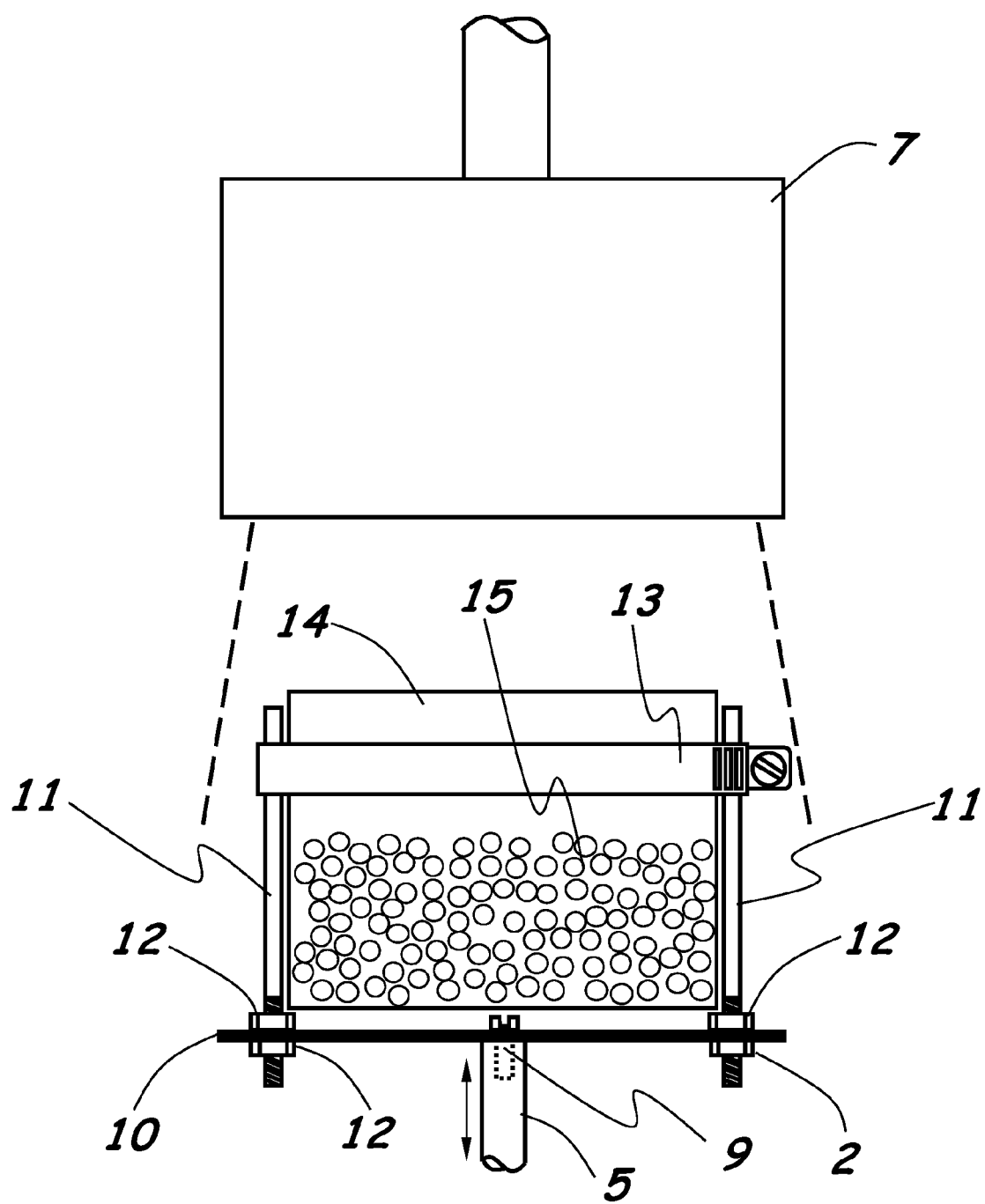
FIG. 3 illustrates a close-up side view of an exemplary sample holder assembly.

FIG. 3 illustrates a close-up side view of an exemplary sample holder assembly 6, as indicated by the dashed line boxes in FIGS. 1 and 2. Rod 5 is rigidly attached to plate 10 by screw 9. Threaded posts 11 are rigidly attached to plate 10 by nuts 12. Sample container 14 sits inside posts 11, and is clamped to posts 11 by a hose clamp 13. Sample particles 15 or alternatively, fibers, are contained in container 14.

Suggested uses for particles produced by the methods and/or apparatus described herein include, but are not limited to, paint additives/pigments, reflective paints/coatings, dyes, metal matrix composites, polymer matrix composites, specialty metal alloys, specialty ceramics, time-release drugs, and passivated catalytic particles.

In exemplary embodiments, thin aluminum and/or tin oxide coatings were sputtered onto glass microspheres from 1-350 micrometers in diameter using DC magnetron sputtering. More specifically, metal coatings were sputtered onto glass microspheres having a size distribution of 212-250 micrometers in diameter (average diameter of about 230 μm) and 1-75 micrometers in diameter (average diameter of about 35 μm). Thus, suggested particle sizes include, but are not limited to, particles having an average major dimension between about 0.001 and about 25 millimeters and preferably particles having an average major dimension between about 1 and about 2000 microns. In certain embodiments, the particles have an aspect ratio of between about 10 and about 10,000. In other exemplary embodiments, metal coatings were deposited onto salt (NaCl) particles that were generally cubic in shape. Thus, the particles may be spherical, cubic, cylindrical, or prismatic. In certain embodiments, the particles are composed of ceramics. In still other embodiments, the particles are composed of oxides, nitrides, borides, or carbides. In other embodiments, the particles are composed of polymers. Suggested polymer particles include, but are not limited to, particles composed of polystyrene, polymethylmethacrylate, polycarbonate, and polyvinylidene difluoride. Suggested fibers include, but are not limited to, glass fibers, carbon fibers, ceramic whiskers and so forth. In certain embodiments, the particle is water soluble. In certain embodiments, the particle is water reactive. In certain embodiments, the particle is oxygen reactive. And, in certain embodiments, the particle is scavengable such that after coating, the coated particle is placed in a scavenging environment to remove the particle and leave intact the coating as a free-standing shell, for example a thin metal coating can be deposited on a NaCl crystal and then the interior NaCl crystal dissolved with water to produce a cubic metal shell. In certain embodiments, the particle is selected from the group comprising NaCl, $WCl_6$, $WOCl_4$, $RuCl_3 \cdot 3H_2O$, Grubbs catalysts, and Schrock catalysts.

In some embodiments, the deposited coating is or at least includes a metal or a metal alloy. Suggested metal coatings include, but are not limited to, coatings that include Cu, Ag, Au, Al, Ni, Cr, Ti, and alloys that include any of the previously listed metals. Suggested metal coatings that provide a barrier that inhibits physical degradation of the particle due to environmental factors include, but are not limited to, coatings that consist of or otherwise include Cu, Ag, Au, Al, Ni, Cr, Ti, and alloys of the same. In certain other embodiments, the present invention provides a coated particle where the particle comprises a metal coating that provides increased electrical conductivity. In still other embodiments, the present invention provides a coated particle where the particle comprises a metal coating that provides a barrier that inhibits physical degradation of the particle due to environmental factors, for example humidity, oxygen, and corrosive chemicals. In yet other embodiments, the deposited coating is or otherwise comprises a ceramic. Suggested ceramic coatings include, but are not limited to, $SiO_2$, $Al_2O_3$, $SnO_2$, $MgF_2$, $TiO_2$, $ZrO_2$, ZnS, MgO, AlN, SiN, $BaTiO_3$, $HfO_2$, $Ta_2O_5$ and so forth. In yet other embodiments, the present invention provides a coated particle where the particle comprises a ceramic coating that provides special optical properties, for example a spectral reflectivity band, a spectral absorption band, or anti-reflective properties. These special optical properties could be engineered over any part of the electromagnetic spectrum, for example within visible frequencies or infrared frequencies.

The present invention also provides a composite material and a method of making composite materials that include particles produced via the methods described herein and dispersed in a polymer matrix. The present invention also provides a composite material comprising particles produced via the methods described herein and dispersed in a metal matrix. And in other embodiments, the present invention provides a composite material comprising particles produced via the methods described herein and dispersed in a ceramic matrix.

Additional details of the invention may be found in a paper titled "A fluidized-bed sputter deposition system for coating microparticles" by Daniel M. Baechle, J. Derek Demaree, James K. Hirvonen and Eric D. Wetzel; a poster titled "A Fluidized Bed Sputter Deposition System for Coating Microparticles" that was presented by Daniel M. Baechle, J. Derek Demaree, James K. Hirvonen and Eric D. Wetzel at the Proceedings of the 54th annual Society of Vacuum Coaters Technical Conference in Chicago 2011; and a journal article titled Magnetron sputter deposition onto fluidized particle beds" by D. M. Baechle, J. D. Demaree, J. K. Hirvonen, and E. D. Wetzel, in Surface and Coatings Technology, V221, p94-103, 2013. The previously listed documents and are hereby incorporated by reference herein.

While the foregoing is directed to embodiments of the present invention, other and further embodiments of the invention may be devised without departing from the basic scope thereof.

The invention claimed is:

1. A method for physical vapor deposition of a coating onto a plurality of particles or fibers, the method comprising:
placing a plurality of particles or fibers in a holder in a chamber,
sealing the chamber,
reducing the pressure inside the chamber,
vibrating the holder and the plurality of particles or fibers in the holder with a means for generating vibration wherein the means for generating vibration is external to the chamber and is connected to the holder through the wall of the chamber via a sealed, mechanical linkage that extends through a wall of the chamber,
and depositing a metal coating or a ceramic coating onto the plurality of particles or fibers.

2. The method of claim 1 wherein the metal coating or the ceramic coating is deposited via sputtering.

3. The method of claim 1 wherein the metal coating or the ceramic coating is deposited via evaporation.

4. The method of claim 1 wherein the means for generating vibration is selected from the group consisting of electromagnetic and piezoelectric shakers.

5. The method of claim 1 wherein the sealed, mechanical linkage comprises a rotary feed-through that transmits the vibration that is generated external to the chamber by the means for generating vibration through a wall of the chamber to the holder inside of the chamber while maintaining reduced pressure inside of the chamber.

6. The method of claim 1 wherein the mechanical linkage comprises an angled metal or an angled composite rod.

7. The method of claim 1 wherein the mechanical linkage comprises a first rigid angled rod that is coupled to the means for generating vibrations, a first shaft coupler rigidly connecting first rigid angled rod to a vacuum-rated rotary motion feedthrough, a second shaft coupler rigidly coupling the feedthrough to a second rigid metal rod that is rigidly connected to the holder.

8. The method of claim 1 wherein the chamber includes more than one deposition source and the coating on the particles comprises an alloy of deposited materials.

9. The method of claim 1 wherein the chamber includes more than one deposition source and the coating on the particles comprises a multi-layer coating.

10. The method of claim 1 wherein the means for generating vibrations and the sealed, mechanical linkage that extends through a wall of the chamber generates a vibrofluidized bed of particles or fibers.

11. The method of claim 1 wherein the particles or fibers are scavengable or soluble and after coating, the coated particles or coated fibers are placed in a scavenging environment to remove the particle and leave the coating as a free-standing shell.

12. The method of claim 1 wherein the environment within the coating chamber is reactive with respect to the coating material.

13. The method of claim 1 wherein the environment within the coating chamber is inert with respect to the coating material.

14. The method of claim 1 wherein the metal coating or the ceramic coating provides desired spectral reflectivity that varies with wavelength.

15. The method of claim 1 wherein the particle comprises a metal coating that provides increased electrical conductivity.

16. The method of claim 1 wherein the particle comprises a metal coating that provides a barrier that inhibits physical degradation of the particle due to environmental factors.

17. The method of claim 16 wherein the particle comprises a barrier that inhibits physical degradation of the particle due to environmental conditions and comprises Cu, Ag, Au, Al, Ni, Cr, Ti, and alloys of the same.

18. The method of claim 1 wherein the particle is selected from the group comprising NaCl, $WCl_6$, $WOCl_4$, $RuCl_3 \cdot 3H_2O$, Grubbs catalysts, and Schrock catalysts.

19. The method of claim 1 wherein the particle is water soluble.

20. The method of claim 1 wherein particle is water reactive.

21. The method of claim 1 wherein particle is oxygen reactive.

22. A composite material comprising coated particles produced by the method of claim 1.

23. The method of claim 1 wherein the mechanical linkage transfers vibratory motion from outside the chamber to inside the chamber.

24. The method of claim 1 wherein the mechanical linkage is a ferro-magnetic fluid rotary feedthrough.

\* \* \* \* \*